United States Patent
Onda

(10) Patent No.: US 9,374,060 B2
(45) Date of Patent: Jun. 21, 2016

(54) PIEZOELECTRIC THIN FILM RESONATOR

(71) Applicant: TAIYO YUDEN CO., LTD., Tokyo (JP)

(72) Inventor: Yosuke Onda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 401 days.

(21) Appl. No.: 14/089,598

(22) Filed: Nov. 25, 2013

(65) Prior Publication Data

US 2014/0167560 A1    Jun. 19, 2014

(30) Foreign Application Priority Data

Dec. 18, 2012  (JP) .................................. 2012-276177

(51) Int. Cl.
*H01L 41/187* (2006.01)
*H03H 9/17* (2006.01)
*H03H 9/02* (2006.01)
*H01L 41/316* (2013.01)

(52) U.S. Cl.
CPC ........... *H03H 9/173* (2013.01); *H03H 9/02015* (2013.01); *H03H 9/174* (2013.01); *H03H 9/175* (2013.01); *H01L 41/187* (2013.01); *H01L 41/316* (2013.01)

(58) Field of Classification Search
CPC .. H01G 7/023; B29C 55/005; B29C 71/0081; B01D 39/083; B01D 39/1623; B01D 2239/10
USPC ............. 310/311–371; 252/62.9 PZ, 62, 9 R; 264/435, 436; 501/134; 257/347
See application file for complete search history.

(56) References Cited

U.S. PATENT DOCUMENTS

| | | | |
|---|---|---|---|
| 9,087,979 B2 * | 7/2015 | Yokoyama | ......... H03H 9/02015 |
| 2005/0140743 A1 | 6/2005 | Miyazawa et al. | |
| 2007/0247260 A1 | 10/2007 | Yanase et al. | |
| 2008/0238257 A1 | 10/2008 | Kawakubo et al. | |
| 2008/0296529 A1 | 12/2008 | Akiyama et al. | |
| 2012/0104900 A1 | 5/2012 | Nishihara et al. | |
| 2015/0287876 A1 * | 10/2015 | Han | ........................ H01L 33/06 257/13 |

FOREIGN PATENT DOCUMENTS

| | | |
|---|---|---|
| CN | 101276707 A | 10/2008 |
| CN | 101325240 A | 12/2008 |
| CN | 102468818 A | 5/2012 |
| JP | 2001-203558 A | 7/2001 |

(Continued)

OTHER PUBLICATIONS

Chinese Office Action dated Mar. 3, 2016, in a counterpart Chinese patent application No. 201310692927.1.

(Continued)

*Primary Examiner* — Thomas Dougherty
(74) *Attorney, Agent, or Firm* — Chen Yoshimura LLP

(57) ABSTRACT

A piezoelectric thin film resonator includes: a substrate; a piezoelectric film that is located on the substrate and includes a first film made of an aluminum nitride film containing an additive element and second films located on an upper surface and a lower surface of the first film and made of an aluminum nitride film containing the additive element at a concentration lower than that of the first film; and a lower electrode and an upper electrode that are located to sandwich the piezoelectric film.

6 Claims, 12 Drawing Sheets

(56) References Cited

FOREIGN PATENT DOCUMENTS

| JP | 2002-344279 A | 11/2002 |
| JP | 2003-60478 A | 2/2003 |
| JP | 2005-159309 A | 6/2005 |
| JP | 2007-277606 A | 10/2007 |
| JP | 2009-10926 A | 1/2009 |

OTHER PUBLICATIONS

Japanese Office Action dated Mar. 29, 2016, in a counterpart Japanese patent application No. 2012-276177.

* cited by examiner

PIEZOELECTRIC THIN FILM RESONATOR

CROSS-REFERENCE TO RELATED APPLICATION

This application is based upon and claims the benefit of priority of the prior Japanese Patent Application No. 2012-276177 filed on Dec. 18, 2012, the entire contents of which are incorporated herein by reference.

FIELD

A certain aspect of the present invention relates to a piezoelectric thin film resonator.

BACKGROUND

Surface acoustic wave (SAW) filters, which are small and light, have been used for filters used in mobile communication devices as typified by mobile phones. The SAW filter includes a piezoelectric substrate and an IDT (InterDigital Transducer) located on the piezoelectric substrate, and operates at a frequency depending on a pitch of electrode fingers of the IDT.

In recent years, the transmission rate of the mobile communication device has been increased. Thus, filters operating at a higher frequency have been developed, but the frequency of the SAW filter depends on the electrode finger pitch of the IDT and therefore, there is a limit on decreasing the electrode finger pitch. Thus, it is difficult to meet the requirement for the higher frequency. Thus, piezoelectric thin film resonators have attracted attention. The piezoelectric thin film resonator has a resonance portion in which a lower electrode, a piezoelectric film, and an upper electrode are stacked on a substrate, and the frequency thereof is determined by the thickness of the resonance portion. Thus, it is easy to make the piezoelectric thin film resonator operate at a higher frequency.

An aluminum nitride film is used for the piezoelectric film of the piezoelectric thin film resonator, for example, but aluminum nitride has a piezoelectric constant and an electromechanical coupling coefficient less than those of other piezoelectric materials. To increase the piezoelectric constant, there has been known a technique that adds scandium (Sc) to aluminum nitride and a technique that provides aluminum nitride films having different content rates of Sc between the substrate and an aluminum nitride film to which Sc is added (e.g. Japanese Patent Application Publication No. 2009-10926).

In addition, it has been known that a piezoelectric film with good crystallinity is obtained by forming and thermally treating a first piezoelectric film and then forming a second piezoelectric film on the first piezoelectric film to form the piezoelectric film (e.g. Japanese Patent Application Publication No. 2007-277606). Furthermore, it has been known that a stress is released and good resonance characteristics are obtained in the piezoelectric thin film resonator by forming the piezoelectric film while changing film forming conditions (e.g. Japanese Patent Application Publication No. 2003-60478). It has been known that good temperature characteristics and good resonance characteristics are obtained by stacking a piezoelectric film with a positive temperature coefficient of resonance frequency and a piezoelectric film with a negative temperature coefficient of resonance frequency (e.g. Japanese Patent Application Publication No. 2001-203558).

When an aluminum nitride film containing an additive element is used for the piezoelectric film of the piezoelectric thin film resonator, degradation of characteristics such as a coupling coefficient, a Q-value, and FOM (Figure of Merit: product of the Q-value and the coupling coefficient) is caused by factors such as orientation and film stress of the piezoelectric film and adhesiveness between the piezoelectric film and the electrode.

SUMMARY OF THE INVENTION

According to an aspect of the present invention, there is provided a piezoelectric thin film resonator including: a substrate; a piezoelectric film that is located on the substrate and includes a first film made of an aluminum nitride film containing an additive element and second films located on an upper surface and a lower surface of the first film and made of an aluminum nitride film containing the additive element at a concentration lower than that of the first film; and a lower electrode and an upper electrode that are located to sandwich the piezoelectric film.

DETAILED DESCRIPTION

Hereinafter, a description will be given of embodiments of the present invention with reference to the attached drawings.

First Embodiment

Figure 1A:
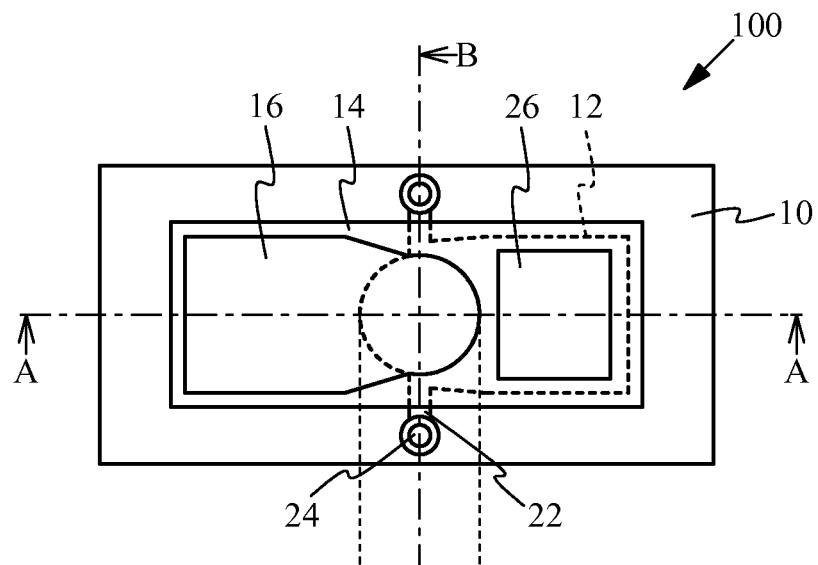
FIG. 1A is a top view of an FBAR in accordance with a first embodiment.
Figure 1B:
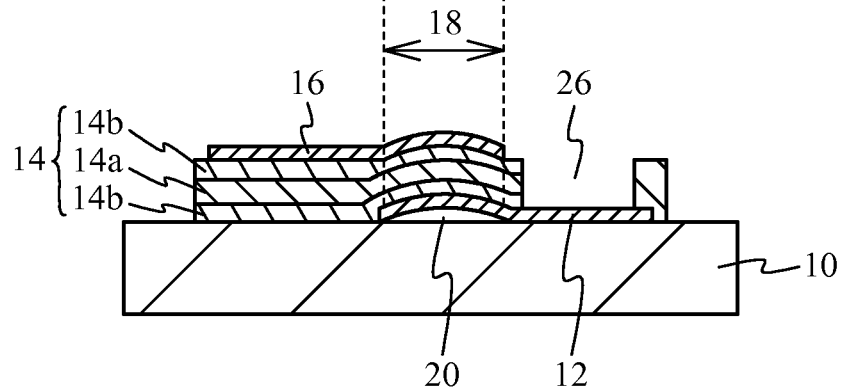
FIG. 1B is a cross-sectional view taken along line A-A in FIG. 1A.
Figure 1C:
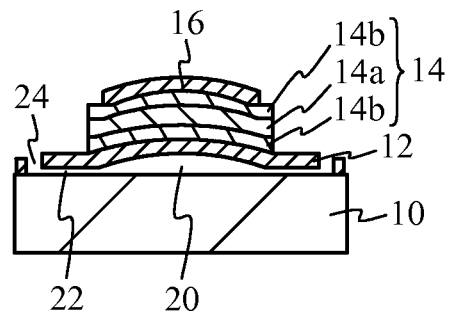
FIG. 1C is a cross-sectional view taken along line B-B in FIG. 1A.

A first embodiment describes an FBAR (Film Bulk Acoustic Resonator), which is an exemplary piezoelectric thin film resonator, as an example. FIG. 1A is a top view of an FBAR in accordance with the first embodiment, FIG. 1B is a cross-sectional view taken along line A-A in FIG. 1A, and FIG. 1C is a cross-sectional view taken along line B-B in FIG. 1A. As illustrated in FIG. 1A through FIG. 1C, an FBAR 100 of the first embodiment includes a substrate 10, a lower electrode 12, a piezoelectric film 14, and an upper electrode 16.

The substrate 10 may be, for example, a silicon (Si) substrate, a gallium arsenide (GaAs) substrate, or an insulating material substrate such as a glass substrate.

The lower electrode 12 is located on the substrate 10. The lower electrode 12 may be, for example, a metal film including at least one of aluminum (Al), copper (Cu), chrome (Cr), molybdenum (Mo), tungsten (W), tantalum (Ta), platinum (Pt), ruthenium (Ru), rhodium (Rh), and iridium (Ir). The lower electrode 12 may be a single-layer film or a multilayered film.

The piezoelectric film 14 is located on the substrate 10 and the lower electrode 12. The piezoelectric film 14 is located in contact with, for example, the upper surface of the lower electrode 12. The piezoelectric film 14 has a crystal structure having c-axis orientation in which the c-axis is a main axis. The piezoelectric film 14 includes a first film 14a and second films 14b located in contact with the upper surface and the lower surface of the first film 14a. The first film 14a is an aluminum nitride (AlN) film containing an additive element. The first embodiment describes a case in which the first film 14a is an AlN film containing a divalent element and a tetravalent element as an example. The second film 14b is an AlN film containing an additive element at a concentration lower than that of the first film 14a. The first embodiment describes a case in which the second film 14b is an AlN film not containing an additive element, i.e. an undoped AlN film as an example.

The upper electrode 16 is located on the piezoelectric film 14 to have a region facing the lower electrode 12. That is to say, the lower electrode 12 and the upper electrode 16 are located so as to sandwich at least a part of the piezoelectric film 14. The upper electrode 16 is located in contact with, for example, the upper surface of the piezoelectric film 14. The region in which the lower electrode 12 and the upper electrode 16 face each other across the piezoelectric film 14 is a resonance portion 18. The upper electrode 16 may be also a metal film including at least one of Al, Cu, Cr, Mo, W, Ta, Pt, Ru, Rh, and Ir listed for the lower electrode 12, and may be a single-layer film or a multilayered film.

An air-space 20 having a dome-shaped bulge is located between the substrate 10 and the lower electrode 12 in the resonance portion 18. The dome-shaped bulge is a bulge having a shape in which the height of the air-space 20 increases at closer distance to the center portion from the peripheral portion of the air-space 20. An introduction path 22 that is formed by introducing an etchant to form the air-space 20 is located under the lower electrode 12. The vicinity of the tip of the introduction path 22 is not covered with the piezoelectric film 14, and the tip of the introduction path 22 is a hole 24. The hole 24 is an introduction port to introduce an etchant used in forming the air-space 20. An aperture 26 that enables electrical connection with the lower electrode 12 is located in the piezoelectric film 14.

When a high-frequency electrical signal is applied between the lower electrode 12 and the upper electrode 16, an acoustic wave excited by inverse piezoelectric effect or an acoustic wave caused by strain due to piezoelectric effect is generated inside the piezoelectric film 14 sandwiched by the lower electrode 12 and the upper electrode 16. Such acoustic waves are totally reflected at surfaces at which the lower electrode 12 and the upper electrode 16 make contact with air, and thus become a thickness vibration wave having a primary displacement in the thickness direction.

A description will next be given of a method of fabricating the FBAR of the first embodiment with reference to FIG. 2A through FIG. 2H. FIG. 2A through FIG. 2D are cross-sections corresponding to the section taken along line A-A in FIG. 1A, and FIG. 2E through FIG. 2H are cross-sections corresponding to the section taken along line B-B in FIG. 1A.

Figure 2A:
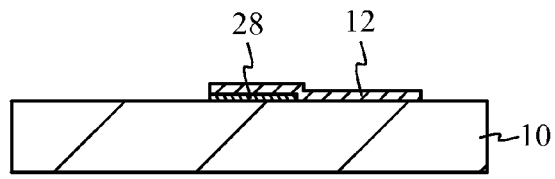
FIG. 2A through FIG. 2H are cross-sectional views illustrating a method of fabricating the FBAR of the first embodiment.
Figure 2E:
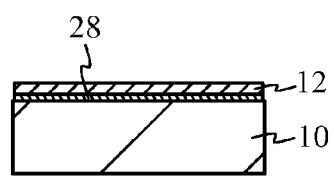

As illustrated in FIG. 2A and FIG. 2E, a sacrifice layer 28 is formed on the substrate 10 by, for example, sputtering or evaporation. The sacrifice layer 28 may be formed of, for example, a magnesium oxide (MgO) film, and is formed so as to form a region in which the air-space 20 is to be formed. The sacrifice layer 28 may have a film thickness of, for example, 20 nm. Then, a metal film is formed on the substrate 10 and the sacrifice layer 28 by, for example, sputtering under an argon (Ar) gas atmosphere. The metal film is selected from at least one of Al, Cu, Cr, Mo, W, Ta, Pt, Ru, Rh, and Ir as described previously. Then, the lower electrode 12 is formed by, for example, photolithographing and etching the metal film into a desired shape. At this point, a part of the lower electrode 12 is made to have a shape covering the sacrifice layer 28.

Figure 2B:
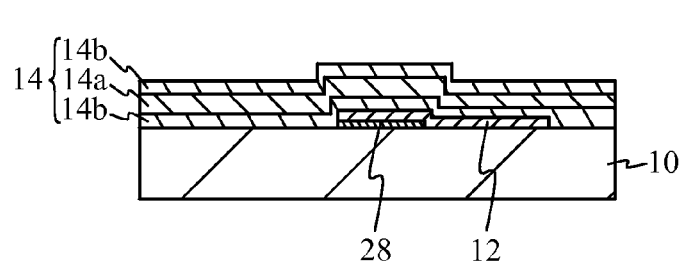
Figure 2F:
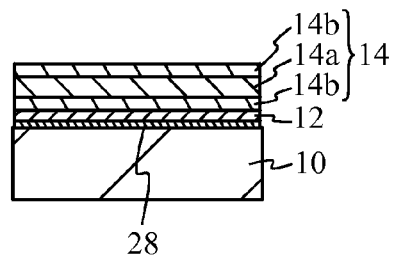

As illustrated in FIG. 2B and FIG. 2F, the second film 14b that is an undoped AlN film is formed on the substrate 10 and the lower electrode 12, of which surfaces are cleaned, by, for example, sputtering an Al target under a mixed gas atmosphere of Ar and nitrogen ($N_2$). Then, the first film 14a that is an AlN film containing a divalent element and a tetravalent element is formed on the second film 14b by simultaneously sputtering an Al target, a divalent element target, and a tetravalent element target under a mixed gas atmosphere of Ar and $N_2$ without removing the substrate 10 from a chamber. Then, the second film 14b that is an undoped AlN film is formed on the first film 14a by sputtering an Al target under a mixed gas atmosphere of Ar and $N_2$ without removing the substrate 10 from the chamber. This process forms the piezoelectric film 14 including the first film 14a and the second films 14b located on the upper surface and the lower surface of the first film 14a. There may be a concentration gradient of concentrations of the divalent element and the tetravalent element near the boundary face between the first film 14a and the second film 14b.

As described above, the first film 14a and the second films 14b are preferably continuously formed in the same chamber. This is because an unnecessary film such as an oxide film can be prevented from being formed on the boundary face between the first film 14a and the second film 14b. When films are continuously formed in the same chamber, the first film 14a and the second film 14b may be continuously formed by adjusting an electrical power applied to the divalent element target and the tetravalent element target or opening and closing shutters to the divalent element target and the tetravalent element target while always discharging the Al target. In addition, the first film 14a and the second films 14b may be formed by separate apparatuses due to any reasons on the apparatuses. In this case, an oxide film is formed on a surface exposed to air, and thus the oxide film is preferably removed by inverse sputtering before the film formation. In addition, an Al target, a divalent element target, and a tetravalent element target are used to form the first film 14a, but an Al alloy target formed by including a divalent element and a tetravalent element into Al may be used.

Figure 2C:
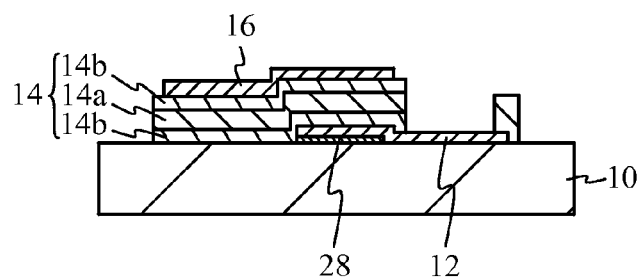
Figure 2G:
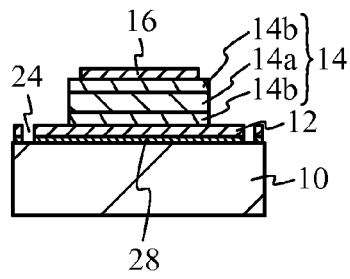

As illustrated in FIG. 2C and FIG. 2G, a metal film is formed on the piezoelectric film 14 by, for example, sputtering under an Ar gas atmosphere. The metal film is also selected from at least one of Al, Cu, Cr, Mo, W, Ta, Pt, Ru, Rh, and Ir as described previously. Then, the upper electrode 16 is formed by, for example, photolithographing and etching the metal film into a desired shape. Then, the piezoelectric film 14 is formed into a desired shape by, for example, photorisography and etching. Further, the hole 24 is formed by selectively etching the lower electrode 12 and the sacrifice layer 28.

Figure 2D:
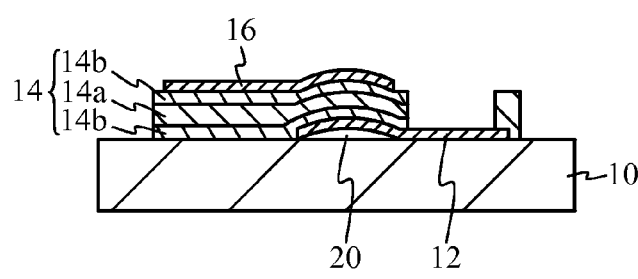
Figure 2H:
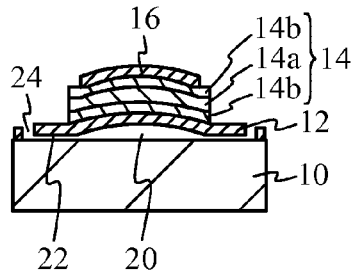

As illustrated in FIG. 2D and FIG. 2F, an etchant is introduced from the hole 24 to etch the sacrifice layer 28. Here, the stress on a multilayered film including the lower electrode 12, the piezoelectric film 14, and the upper electrode 16 is preliminarily set to a compression stress. This allows the multilayered film to bulge out when the etching of the sacrifice layer 28 is completed, and thereby the air-space 20 having a dome-shaped bulge is formed between the substrate 10 and the lower electrode 12. In addition, the introduction path 22 connecting the air-space 20 to the hole 24 is also formed. The FBAR of the first embodiment is formed through the above-described fabrication process.

Figure 3:
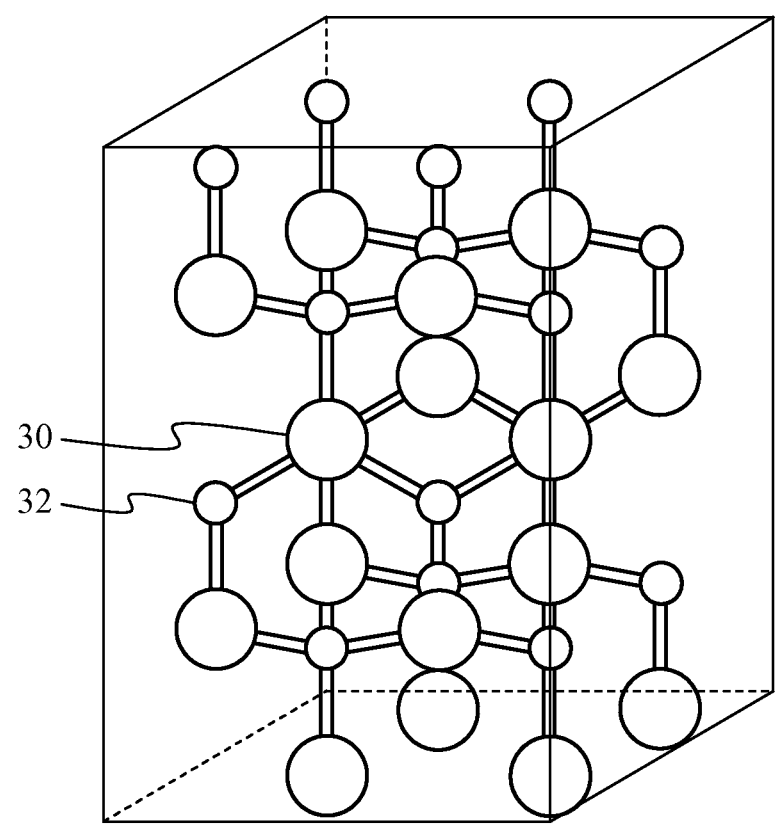
FIG. 3 is a diagram illustrating a structure of undoped AlN used in a simulation.

A description will be given of a reason why it is preferable to use an AlN film containing a divalent element and a tetravalent element for the piezoelectric film of the FBAR. FIG. 3 is a diagram illustrating the structure of undoped AlN used in the simulation. The simulation was conducted with a method called as a first principle calculation. Methods of calculating an electronic state without using fitting parameters or the like are collectively referred to as the first principle calculation, which can calculate the electronic state by using only atomic numbers and coordinates of atoms constituting a unit lattice or a molecule. As illustrated in FIG. 3, undoped AlN used in the simulation has sixteen aluminum atoms 30 and sixteen nitrogen atoms 32. That is to say, it has a wurtzite-type crystal structure that is a supercell containing sixteen aluminum atoms 30 and sixteen nitrogen atoms 32 obtained by doubling a unit lattice containing two aluminum atoms 30 and two nitrogen atoms 32 in a-axis, b-axis, and c-axis directions. The first principle calculation is performed to AlN with the wurtzite-type crystal structure by moving an atomic coordinate, a cell volume, and a cell shape simultaneously, and the electronic state of undoped AlN in a stable structure is calculated. Then, a small strain is forcibly applied to the crystal lattices of undoped AlN in a stable structure to calculate the piezoelectric constant, the elastic constant, and the permittivity of undoped AlN from the minor change of the total energy at that time by the first principle calculation.

The first principle calculation is also performed to doped AlN with a crystal structure in which one of the aluminum atoms 30 in FIG. 3 is substituted by a divalent element and another one of the aluminum atoms 30 is substituted by a tetravalent element as well as to undoped AlN. That is to say, calculated are material constants including the piezoelectric constant, the elastic constant, and the permittivity of doped AlN with a wurtzite-type crystal structure containing fourteen aluminum atoms, one divalent element, one tetravalent element, and sixteen nitrogen atoms by the first principle calculation. Here, referred to as a substitutional concentration is an atomic concentration of an additive element when a total of the number of aluminum atoms and the number of atoms of the additive element defines 100 atomic %. Thus, the substitutional concentrations of the divalent element and the tetravalent element of doped AlN used in the simulation are 6.25 atomic %. In the simulation, calcium (Ca), magnesium (Mg), strontium (Sr), or zinc (Zn) is used as the divalent element, and titanium (Ti), zirconium (Zr), or hafnium (Hf) is used as the tetravalent element. The divalent element and the tetravalent element are added at the same ratio in order to secure the insulation property because both the divalent element and the tetravalent element substitute a trivalent aluminum site.

Here, the relationship among a piezoelectric constant $e_{33}$, an elastic constant $C_{33}$, and a permittivity $\epsilon_{33}$ in the c-axis direction and an electromechanical coupling coefficient $k^2$ is expressed by the following equation 1.

$$K^2 = \frac{e_{33}^2}{\varepsilon_{33} \times C_{33}} \qquad \text{[Equation 1]}$$

Thus, the electromechanical coupling coefficients of undoped AlN and doped AlN can be calculated by calculating their piezoelectric constants, elastic constants, and permittivities by the first principle calculation.

Table 1 lists the calculated values of the piezoelectric constants $e_{33}$ and the values of the electromechanical coupling coefficients $k^2$ calculated from the equation 1 of undoped AlN and doped AlN. As presented in Table 1, AlN containing a divalent element and a tetravalent element (Case 1 to Case 10) has a piezoelectric constant $e_{33}$ and an electromechanical coupling coefficient $k^2$ greater than those of undoped AlN (Undoped AlN in Table 1). The divalent element and the tetravalent element are not limited to those presented in Table 1, and may be other elements.

TABLE 1

| Combination | Divalent element | Tetravalent element | Piezoelectric constant $e_{33}$ [C/m$^2$] | Electromechanical coupling coefficient $k^2$ [%] |
|---|---|---|---|---|
| Case 1 | Ca | Ti | 1.77 | 9.68 |
| Case 2 | Ca | Zr | 1.85 | 10.3 |
| Case 3 | Ca | Hf | 2.17 | 14.2 |
| Case 4 | Mg | Ti | 2.09 | 12.9 |
| Case 5 | Mg | Zr | 2.13 | 13.5 |
| Case 6 | Mg | Hf | 2.46 | 17.6 |
| Case 7 | Sr | Hf | 1.96 | 11.3 |
| Case 8 | Zn | Ti | 2.08 | 12.5 |
| Case 9 | Zn | Zr | 2.01 | 12.4 |
| Case 10 | Zn | Hf | 2.32 | 11.1 |
| Undoped AlN | — | — | 1.55 | 7.12 |

A description will next be given of a substitutional concentration dependency of the electromechanical coupling coefficient of AlN containing a divalent element and a tetravalent element. The substitutional concentration dependency of the electromechanical coupling coefficient was evaluated by performing the first principle calculation to multiple doped AlN having different sizes of the supercell and different numbers of aluminum atoms substituted by a divalent element and a tetravalent element in the wurtzite-type crystal structure in FIG. 3. Mg is used as the divalent element, and Hf or Ti is used as the tetravalent element, and a ratio of the substitutional concentration of the divalent element is made to be equal to that of the tetravalent element.

Figure 4A:
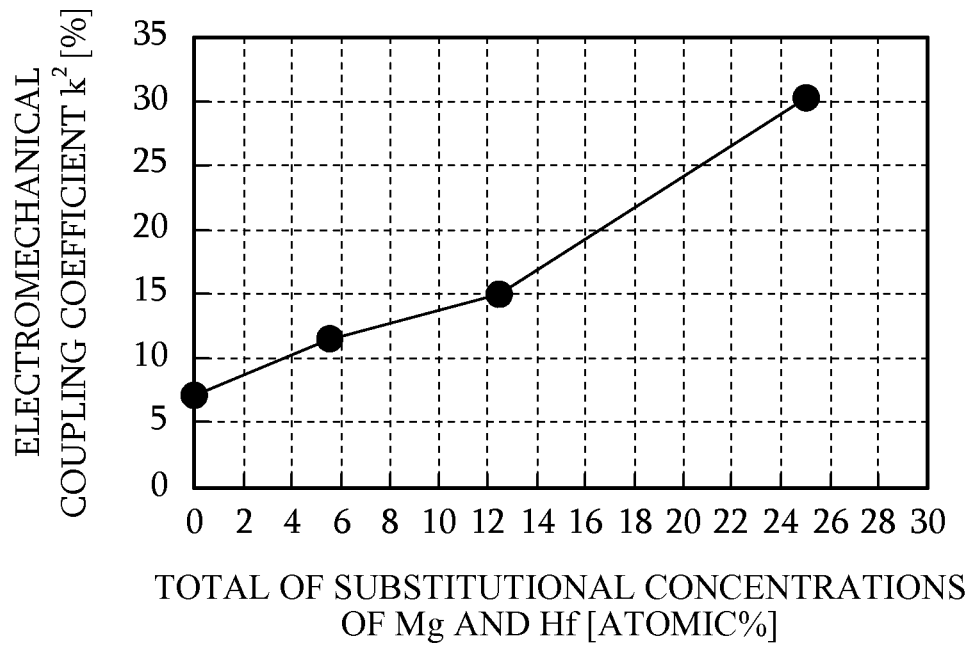
FIG. 4A and FIG. 4B are diagrams illustrating an electromechanical coupling coefficient of AlN with respect to a total of substitutional concentrations of a divalent element and a tetravalent element.
Figure 4B:
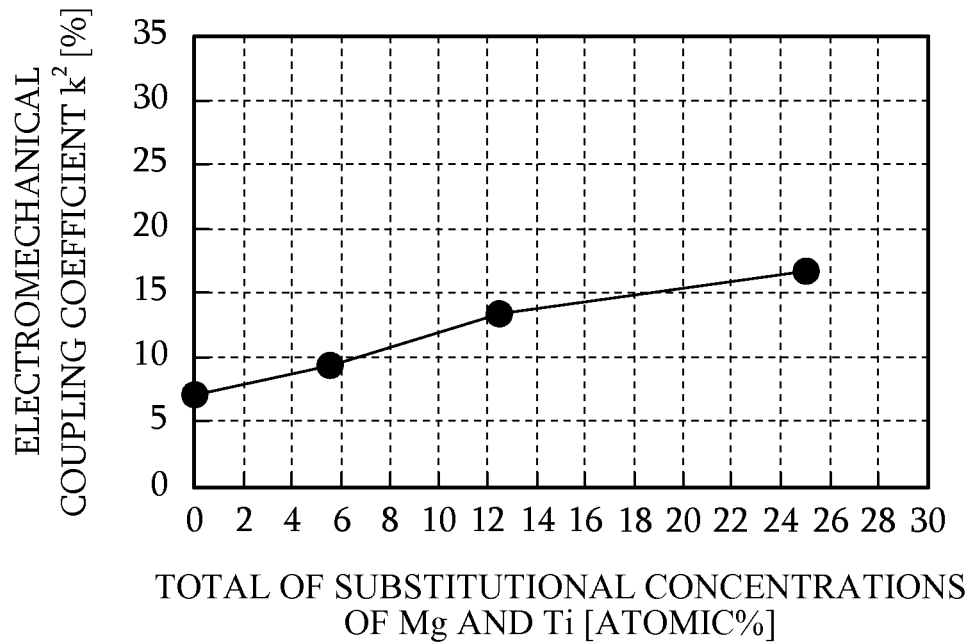

FIG. 4A and FIG. 4B are diagrams illustrating the electromechanical coupling coefficient $k^2$ of AlN with respect to a total of substitutional concentrations of the divalent element and the tetravalent element. FIG. 4A illustrates a simulation result when Mg is used for the divalent element, and Hf is used for the tetravalent element while FIG. 4B illustrates a simulation result when Mg is used for the divalent element and Ti is used for the tetravalent element. FIG. 4A and FIG. 4B demonstrate that the electromechanical coupling coefficient $k^2$ increases as the substitutional concentration increases in both cases in which Mg and Hf or Mg and Ti are added to AlN. In FIG. 4A and FIG. 4B, the case in which Mg is used for the divalent element and Hf or Ti is used for the tetravalent element is described, but the same tendency is observed when other divalent element and tetravalent element are used.

Figure 5:
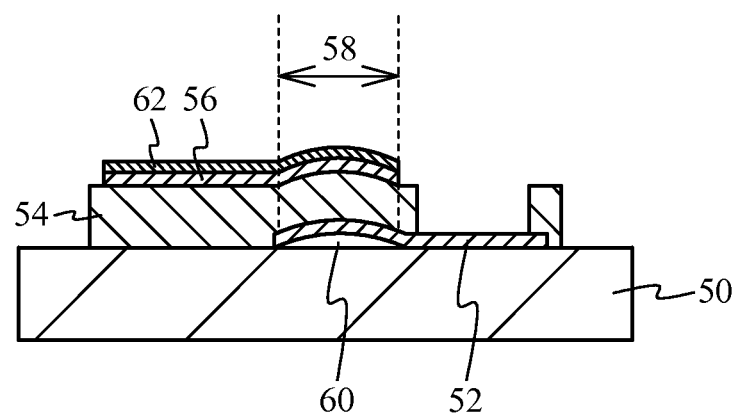
FIG. 5 is a cross-sectional view of an FBAR in accordance with a first comparative example.

A description will next be given of a simulation that examined the effective electromechanical coupling coefficient of an FBAR of a first comparative example that uses an AlN film containing a divalent element and a tetravalent element for the piezoelectric film. FIG. 5 is a cross-sectional view of an FBAR in accordance with the first comparative example. As illustrated in FIG. 5, the FBAR of the first comparative example is formed by stacking a lower electrode 52, a piezoelectric film 54, and an upper electrode 56 on a substrate 50 in this order from the substrate 50 side. The lower electrode 52 is a multilayered metal film formed by stacking Cr with a film thickness of 100 nm and Ru with a film thickness of 225 nm in this order from the substrate 50 side. The piezoelectric film 54 is a single layer of an AlN film containing a divalent element and a tetravalent element and having a film thickness of 1000 nm. Ca, Mg, Sr, or Zn is used for the divalent element, and Ti, Zr, or Hf is used for the tetravalent element, and both the substitutional concentrations of the divalent element and the tetravalent element are set to 6.25 atomic %. Values calculated by the first principle calculation are used for the values of the material constants of the piezoelectric film 54 such as a piezoelectric constant, an elastic constant, and a permittivity. The upper electrode 56 is a multilayered metal film formed by stacking Ru with a film thickness of 225 nm and Cr with a film thickness of 30 nm in this order from the substrate 50 side. A silicon dioxide ($SiO_2$) film 62 with a film thickness of 50 nm is located on the upper electrode 56. An air-space 60 having a dome-shaped bulge is located between the substrate 50 and the lower electrode 52 in a resonance portion 58 that is a region in which the lower electrode 52 and the upper electrode 56 face each other across the piezoelectric film 54.

Also examined was an effective electromechanical coupling coefficient of an FBAR of a second comparative example that has the same structure as that of the FBAR of the first comparative example except that an undoped AlN film with a film thickness of 1150 nm is used for the piezoelectric film 54.

Table 2 lists simulation results of the effective electromechanical coupling coefficients $k_{eff}^2$ of the FBARs of the first comparative example and the second comparative example. As presented in Table 2, the FBARs of the first comparative example using an AlN film containing a divalent element and a tetravalent element for the piezoelectric film 54 (Case 1 to Case 10) have effective electromechanical coupling coefficients $k_{eff}^2$ greater than that of the FBAR of the second comparative example using an undoped AlN film for the piezoelectric film 54 (Undoped AlN film in Table 2). The divalent element and the tetravalent element are not limited to those presented in Table 2, and may be other elements.

TABLE 2

| Combination | Divalent element | Tetravalent element | Resonance frequency [MHz] | Anti-resonance frequency [MHz] | $k_{eff}^2$ [%] |
|---|---|---|---|---|---|
| Case 1 | Ca | Ti | 1928.9 | 2011.9 | 9.77 |
| Case 2 | Ca | Zr | 1895.8 | 1983.2 | 10.4 |
| Case 3 | Ca | Hf | 1875.7 | 1998.3 | 14.2 |
| Case 4 | Mg | Ti | 1930.3 | 2043.8 | 12.9 |
| Case 5 | Mg | Zr | 1911.9 | 2030.3 | 13.5 |
| Case 6 | Mg | Hf | 1886.9 | 2043.9 | 17.5 |
| Case 7 | Sr | Hf | 1901.5 | 1998.3 | 11.4 |
| Case 8 | Zn | Ti | 1940.1 | 2050.4 | 12.6 |
| Case 9 | Zn | Zr | 1888.3 | 1995.0 | 12.5 |
| Case 10 | Zn | Hf | 1887.5 | 2027.7 | 15.9 |
| Undoped AlN film | — | — | 1963.0 | 2024.0 | 7.22 |

The above-described simulation results reveal that it is preferable to use an AlN film containing a divalent element and a tetravalent element for the piezoelectric film of an FBAR to obtain an FBAR having a large electromechanical coupling coefficient. In addition, FIG. 4A and FIG. 4B reveal that it is preferable to increase the concentrations of the divalent element and the tetravalent element to obtain a large electromechanical coupling coefficient.

However, although having an advantage in obtaining a large electromechanical coupling coefficient, the FBAR of the first comparative example also has a disadvantage. The following describes the disadvantage. In the FBAR of the first comparative example, the piezoelectric film 54 is a single layer of an AlN film containing a divalent element and a tetravalent element, and thus the additive concentration of the whole of the piezoelectric film 54 increases when the concentrations of the divalent element and the tetravalent element are increased to obtain a large electromechanical coupling coefficient. In the process of forming the piezoelectric film 54 on the upper surface of the lower electrode 52, it becomes more difficult to obtain the piezoelectric film 54 having good c-axis orientation as the concentration of the additive element increases. Thus, the degradation of the coupling coefficient of the FBAR occurs.

Moreover, when an element is added to an AlN film, the film stress changes. A description will be given of a change of film stress by using a case in which Mg and Zr are added to an AlN film as an example. To examine the change of the film stress, fabricated was an AlN film containing Mg and Zr by sputtering. More specifically, AlN films that have different concentrations of Mg and Zr were fabricated on a substrate by separately simultaneously discharging an Al target, an Al—Mg alloy target, and a Zr target under a mixed gas atmosphere of Ar and $N_2$ to change an electrical power applied to each target. The film stresses of the fabricated AlN films were then measured. The film stress was measured with a thin film stress evaluation apparatus, and the film stress was evaluated from the quantity of warp of the substrate before and after the film formation.

Figure 6:
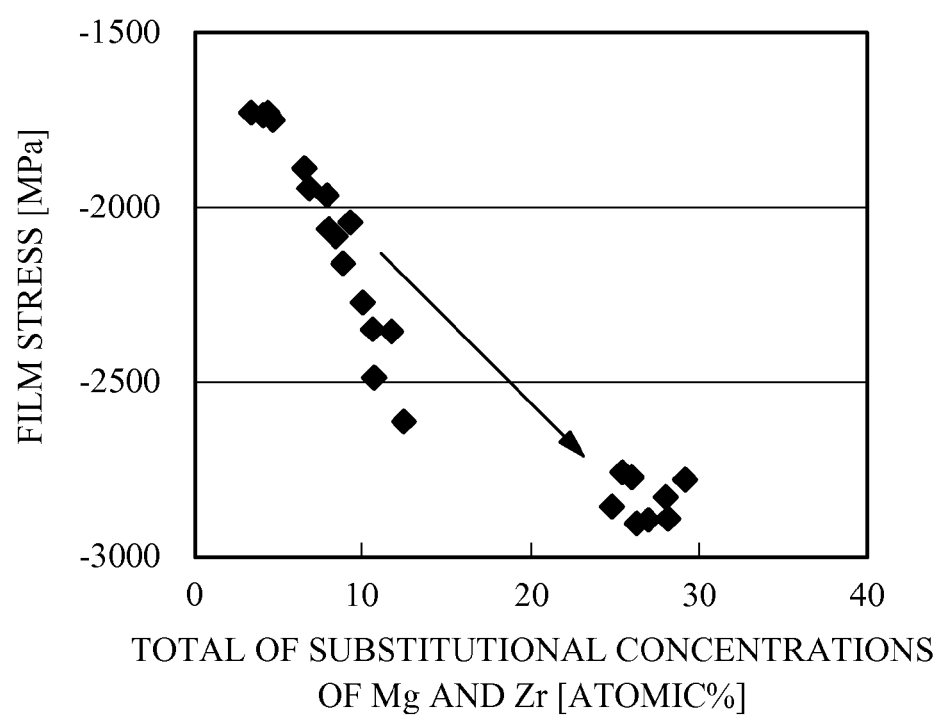
FIG. 6 is a diagram illustrating a film stress of an AlN film with respect to a total of substitutional concentrations of Mg and Zr.

FIG. 6 is a diagram illustrating the film stress of the AlN film with respect to a total of substitutional concentrations of Mg and Zr. The vertical axis of FIG. 6 represents a film stress by negative values, and the negative value means compression stress. As illustrated in FIG. 6, the magnitude (absolute value) of the compression stress of the AlN film to which Mg and Zr are added increases approximately linearly as the total of substitutional concentrations of Mg and Zr increases within a range in which the total of substitutional concentrations of Mg and Zr is greater than or equal to at least 3 atomic % and less than or equal to 30 atomic %. This reveals that the compression stress of the AlN film to which Mg and Zr are added becomes greater than that of an undoped AlN film, and the compression stress increases as the total of substitutional concentrations of Mg and Zr increases.

The reason why the compression stress is increased by adding Mg and Zr to an AlN film is considered as described in the following. That is to say, Mg and Zr substitute aluminum sites of AlN. Considering Shannon ionic radius used in a discussion about a geometric structure of a crystal, the coordination number of an aluminum site in AlN with a wurtzite-type crystal structure is four, the ionic radii of $Mg^{2+}$, $Zr^{4+}$, and $Al^{3+}$ when the coordination number is four are 0.57 nm, 0.59 nm, and 0.39 nm respectively. The aluminum site is substituted by Mg or Zr having an ionic radius greater than that of Al, and thereby the crystal lattice expands, and the compression stress increases. Not limited to the case in which Mg and Zr are added to an AlN film, the film stress changes depending on the concentration of the additive element in the case in which other elements are added to the AlN film.

Table 3 lists measurement values of the substitutional concentrations and the film stresses of Mg and Zr at each plot in FIG. 6. Table 3 reveals that the compression stress of an AlN film to which Mg and Zr are added increases as a total of substitutional concentrations of Mg and Zr increases not only in a case in which a ratio of substitutional concentrations of Mg to Zr is around 1:1 but also in a case in which it is slightly displaced from 1:1.

TABLE 3

| Additive material composition [atomic %] | | | Film stress |
|---|---|---|---|
| Mg | Zr | Mg + Zr | [MPa] |
| 13.2 | 13.7 | 26.9 | −2889.5 |
| 13.2 | 13.1 | 26.3 | −2898.4 |
| 13.5 | 12.0 | 25.5 | −2750.2 |
| 13.6 | 11.2 | 24.8 | −2849.3 |
| 13.3 | 12.6 | 25.9 | −2762.3 |
| 13.2 | 14.9 | 28.1 | −2879.5 |
| 13.0 | 15.0 | 28.0 | −2822.2 |
| 4.2 | 6.5 | 10.7 | −2478.1 |
| 4.5 | 5.6 | 10.1 | −2269.3 |
| 4.3 | 8.2 | 12.5 | −2605.1 |
| 4.8 | 4.0 | 8.8 | −2155.6 |
| 13.4 | 13.8 | 27.2 | −2885.0 |
| 4.8 | 3.1 | 7.9 | −2055.4 |
| 12.5 | 16.6 | 29.1 | −2771.2 |
| 0.0 | 1.6 | 1.6 | −1481.9 |
| 2.0 | 2.0 | 4.0 | −1739.3 |
| 1.9 | 2.6 | 4.5 | −1743.3 |
| 1.9 | 2.3 | 4.2 | −1330.3 |
| 2.1 | 1.1 | 3.2 | −1723.3 |
| 3.4 | 3.4 | 6.8 | −1945.7 |
| 3.5 | 3.1 | 6.6 | −1877.6 |
| 3.4 | 4.3 | 7.7 | −1960.1 |
| 2.1 | 2.0 | 4.1 | −1448.1 |
| 1.9 | 2.3 | 4.2 | −1724.4 |
| 3.3 | 5.0 | 8.3 | −2080.8 |
| 3.3 | 5.8 | 9.1 | −2035.6 |
| 3.2 | 7.4 | 10.6 | −2346.9 |
| 3.2 | 8.4 | 11.6 | −2349.8 |

As described above, when an AlN film containing an additive element is used for the piezoelectric film 54, the film stress changes depending on the concentration of the additive element. When the film stress of the piezoelectric film 54 is too high, the resonance portion 58 is broken. On the other hand, when the film stress of the piezoelectric film 54 is too low, the air-space 60 having a dome-shaped bulge is difficult to be formed, and characteristics of the FBAR are not obtained.

Furthermore, as the concentration of the additive element of the piezoelectric film 54 increases, the adhesiveness between the piezoelectric film 54 and the lower electrode 52 and the upper electrode 56 decreases. This causes loss of the acoustic wave energy, and causes the degradation of characteristics such as a Q-value and a coupling coefficient.

Therefore, when the piezoelectric film 54 is a single layer of an AlN film containing a divalent element and a tetravalent element as described in the first comparative example, the degradation of characteristics such as a Q-value and a coupling coefficient is caused by the orientation and the film stress of the piezoelectric film 54 and the adhesiveness between the piezoelectric film 54 and the lower electrode 52 and the upper electrode 56.

On the other hand, in the first embodiment, as illustrated in FIG. 1A through FIG. 1C, the piezoelectric film 14 sandwiched by the lower electrode 12 and the upper electrode 16 includes the first film 14a made of an AlN film containing an additive element and the second films 14b located on the upper surface and the lower surface of the first film 14a and containing the additive element at a concentration lower than that of the first film 14a. Even when the concentration of the additive element of the first film 14a is increased to obtain a large electromechanical coupling coefficient, the second film 14b having a concentration of the additive element lower than that of the first film 14a is formed on the upper surface of the lower electrode 12. Thus, the c-axis orientation of the piezoelectric film 14 can be improved compared to a case in which the first film 14a is formed directly on the upper surface of the lower electrode 12. In addition, it is difficult to adjust the film stress of an AlN film containing an additive element by film forming conditions such as gas pressure. However, in the first embodiment, the piezoelectric film 14 includes the first film 14a and the second film 14b having different concentrations of the additive element, and thus adjusting the concentrations of the additive element enables to obtain a large electromechanical coupling coefficient and to make the film stress have an appropriate magnitude. Furthermore, the second film 14b containing the additive element at a concentration lower than that of the first film 14a is formed on the upper surface of the lower electrode 12 and the lower surface of the upper electrode 16, and thus the adhesiveness between the piezoelectric film 14 and the lower electrode 12 and the upper electrode 16 can be improved. Therefore, the first embodiment can prevent the degradation of characteristics of the FBAR such as a Q-value and a coupling coefficient.

In addition, both the first film 14a and the second film 14b are films composed primarily of AlN. When the multilayered film is formed of different piezoelectric materials, a mismatch boundary face is formed in terms of a crystal structure, the scattering of the acoustic wave occurs, and the characteristics degrades. However, as described in the first embodiment, when both the first film 14a and the second film 14b are configured to be films composed primarily of AlN, this makes the scattering of the acoustic wave at the boundary face difficult to occur, and can prevent the degradation of characteristics such as a Q-value and a coupling coefficient.

To obtain a large electromechanical coupling coefficient, the first film 14a having a higher concentration of the additive element preferably has a thickness greater than that of the second film 14b. For example, to obtain an FBAR with 2 GHz band, the thickness of the piezoelectric film 14 is configured to be approximately 1000 nm, and thus the first film 14a may be configured to have a thickness of 400 nm, and the second film 14b is configured to have a thickness of 300 nm. That is to say, the piezoelectric film 14 is configured to be a multi-layered film of the second film 14b with a thickness of 300 nm, the first film 14a of a thickness of 400 nm, and the second film 14b of a thickness of 300 nm. In addition, the electromechanical coupling coefficient can be adjusted by changing the film thickness ratio of the first film 14a and the second film 14b.

As described in the first embodiment, it is preferable to use an AlN film containing a divalent element and a tetravalent element for the piezoelectric film 14 to obtain a large electromechanical coupling coefficient. In this case, the divalent element and the tetravalent element are not limited to those presented in Table 1 and Table 2, and may be other elements. In addition, even when the elements presented in Table 1 and Table 2 are used, the piezoelectric film 14 may include two or more of Ca, Mg, Sr, and Zn as a divalent element, and two or more of Ti, Zr, and Hf as a tetravalent element. That is to say, the piezoelectric film 14 may include at least one of Ca, Mg, Sr, and Zn as a divalent element and at least one of Ti, Zr, and Hf as a tetravalent element.

Here, a description will be given of an experiment that fabricated an AlN film containing a divalent element and a tetravalent element, and then measured the piezoelectric constant of the AlN film. The AlN film containing a divalent element and a tetravalent element was fabricated on a low resistance silicon substrate with a resistivity of less than or equal to $0.002\Omega$ by the method same as that described in the measurement of the film stress in FIG. 6. Therefore, AlN films having different concentrations of Mg and Zr were fabricated on the low resistance silicon substrate. Then, a platinum electrode having a diameter of 3 mm and a film thickness of 100 nm was formed on each of the AlN films by sputtering. After the platinum electrode was formed, the piezoelectric constants of the AlN films were measured. The piezoelectric constant was measured with a piezometer under the conditions with a load of 0.25 N and a frequency of 110 Hz.

Figure 7:
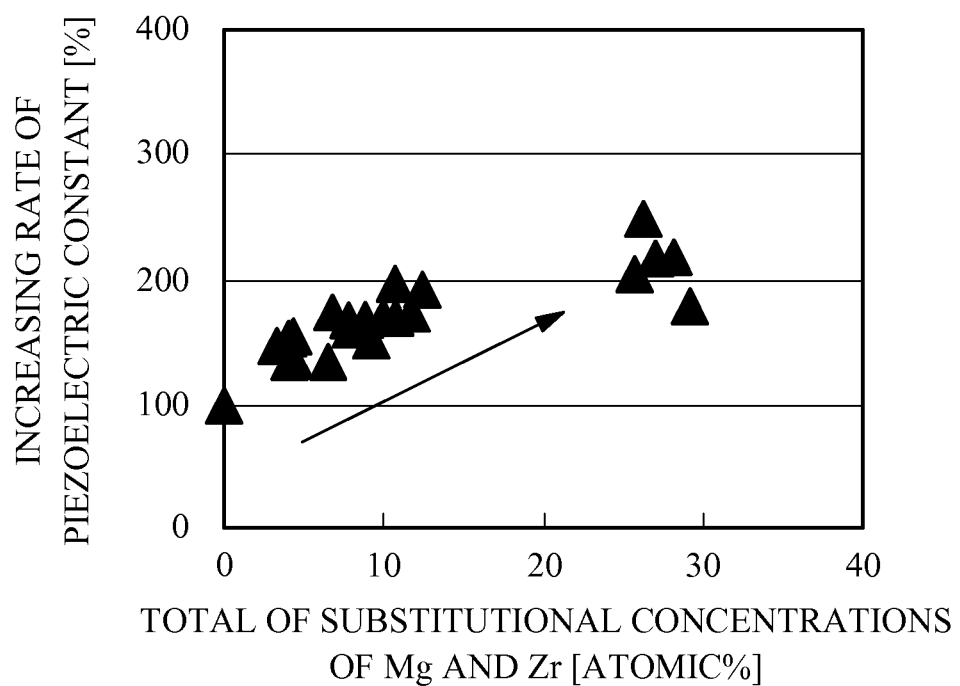
FIG. 7 is a diagram illustrating an increasing rate of a piezoelectric constant of the AlN film with respect to a total of substitutional concentrations of Mg and Zr.

FIG. 7 is a diagram illustrating an increasing rate of the piezoelectric constant of the AlN film with respect to a total of substitutional concentrations of Mg and Zr. The vertical axis of FIG. 7 represents an increasing rate of the piezoelectric constant in percentage, and defines the piezoelectric constant of an undoped AlN film as 100%. As illustrated in FIG. 7, the piezoelectric constant of the AlN film containing Mg and Zr is greater than that of the undoped AlN film within a range in which the total of substitutional concentrations of Mg and Zr is at least greater than or equal to 3 atomic % and less than or equal to 30 atomic %. In addition, the piezoelectric constant of the AlN film increases approximately linearly with respect to the total of substitutional concentrations of Mg and Zr within a range in which the total of substitutional concentrations of Mg and Zr is at least greater than or equal to 3 atomic % and less than or equal to 30 atomic %.

Table 4 lists the substitutional concentrations of Mg and Zr and the measurement value of the piezoelectric constant at each plot in FIG. 7. Table 4 reveals that the AlN films to which Mg and Zr are added have piezoelectric constants greater than that of the undoped AlN film not only in a case in which the ratio of substitutional concentrations of Mg to Zr is around 1:1 but also in a case in which it is displaced from 1:1.

TABLE 4

| Additive material composition [atomic %] | | | Piezoelectric constant | Increasing rate of piezoelectric constant (Undoped |
|---|---|---|---|---|
| Mg | Zr | Mg + Zr | d33 [pC/N] | AlN defines 1) |
| 13.2 | 13.7 | 26.9 | 9.3 | 2.17 |
| 13.2 | 13.1 | 26.3 | 10.6 | 2.47 |
| 13.2 | 14.9 | 28.1 | 9.4 | 2.18 |
| 13.5 | 12.3 | 25.8 | 8.8 | 2.04 |

TABLE 4-continued

| Additive material composition [atomic %] | | | Piezoelectric constant | Increasing rate of piezoelectric constant (Undoped |
|---|---|---|---|---|
| Mg | Zr | Mg + Zr | d33 [pC/N] | AlN defines 1) |
| 4.2 | 6.5 | 10.7 | 8.4 | 1.95 |
| 4.5 | 5.6 | 10.1 | 7.3 | 1.70 |
| 4.3 | 8.2 | 12.5 | 8.2 | 1.91 |
| 4.8 | 4.0 | 8.8 | 7.2 | 1.66 |
| 13.4 | 13.8 | 27.2 | 9.2 | 2.15 |
| 4.8 | 3.1 | 7.9 | 6.9 | 1.60 |
| 12.5 | 16.6 | 29.1 | 7.7 | 1.78 |
| 2.0 | 2.0 | 4.0 | 6.5 | 1.52 |
| 1.9 | 2.6 | 4.5 | 6.4 | 1.48 |
| 1.9 | 2.3 | 4.2 | 5.9 | 1.36 |
| 2.1 | 1.1 | 3.2 | 6.3 | 1.47 |
| 3.4 | 3.4 | 6.8 | 7.4 | 1.71 |
| 3.5 | 3.1 | 6.6 | 5.7 | 1.33 |
| 3.4 | 4.3 | 7.7 | 7.2 | 1.67 |
| 2.1 | 2.0 | 4.1 | 5.8 | 1.35 |
| 1.9 | 2.3 | 4.2 | 6.7 | 1.55 |
| 3.3 | 5.8 | 9.1 | 6.6 | 1.53 |
| 3.2 | 7.4 | 10.6 | 7.3 | 1.71 |
| 3.2 | 8.4 | 11.6 | 7.4 | 1.72 |
| 0 | 0 | 0 | 4.3 | 1 |

A description will next be given of a substitutional concentration dependency of a piezoelectric constant of AlN containing Mg or Zn as a divalent element and one of Hf, Ti, and Zr as a tetravalent element. The substitutional concentration dependency of the piezoelectric constant was evaluated by the first principle calculation.

Figure 8A:
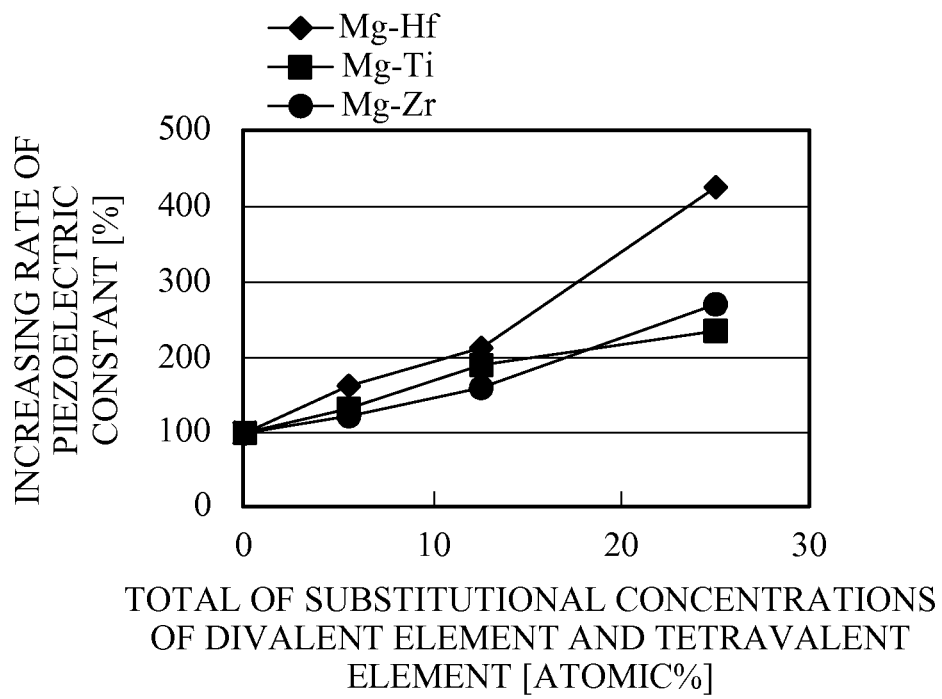
FIG. 8A and FIG. 8B are diagrams illustrating an increasing rate of a piezoelectric constant of AlN with respect to a total of substitutional concentrations of a divalent element and a tetravalent element.
Figure 8B:
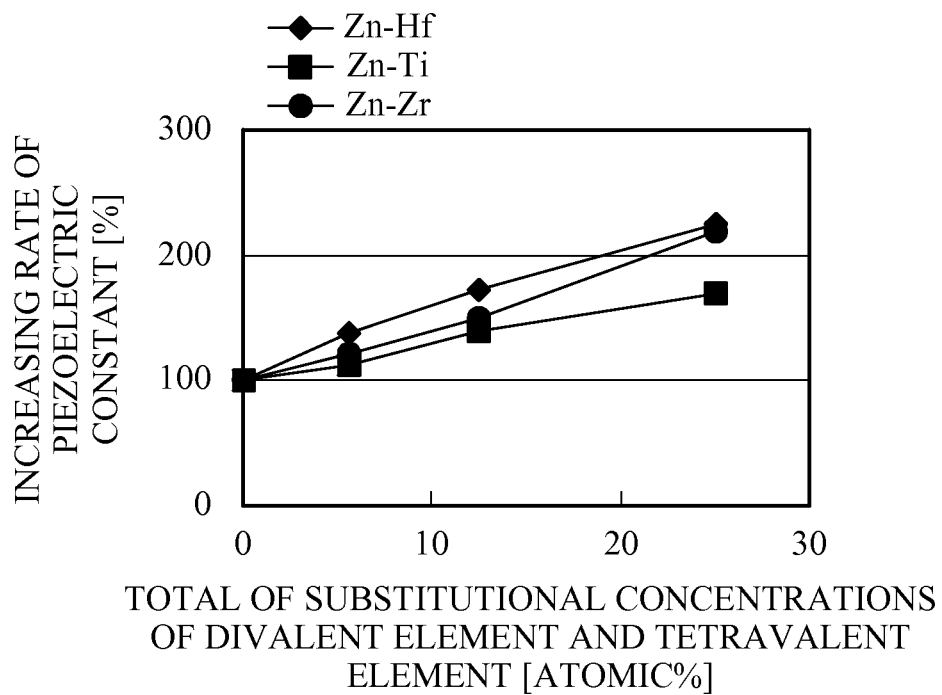

FIG. 8A and FIG. 8B are diagrams illustrating an increasing rate of the piezoelectric constant of AlN with respect to a total of substitutional concentrations of the divalent element and the tetravalent element. The vertical axis in FIG. 8A and FIG. 8B represents an increasing rate of the piezoelectric constant in percentage, and defines the piezoelectric constant of undoped AlN as 100%. FIG. 8A illustrates a case in which Mg is added as the divalent element and one of Hf, Ti, and Zr is added as the tetravalent element while FIG. 8B illustrates a case in which Zn is added as the divalent element and one of Hf, Ti, and Zr is added as the tetravalent element. As illustrated in FIG. 8A and FIG. 8B, the piezoelectric constant monotonously increases with respect to the substitutional concentration in entire cases in which Mg or Zn is added as the divalent element and one of Hf, Ti, and Zr is added as the tetravalent element. This result suggests that the same tendency appears even when other divalent element and tetravalent element are used although FIG. 7 illustrates only measurement results when Mg is used for the divalent element and Zr is used for the tetravalent element.

The results presented in FIG. 7 through FIG. 8B demonstrate that the total of substitutional concentrations of the divalent element and the tetravalent element of the piezoelectric film 14 is preferably set to greater than or equal to 3 atomic % and less than or equal to 30 atomic %. This enables to increase the piezoelectric constant of the piezoelectric film 14, and thereby increase the electromechanical coupling coefficient of the FBAR. To further increase the electromechanical coupling coefficient of the FBAR, the total of substitutional concentrations of the divalent element and the tetravalent element is more preferably greater than or equal to 5 atomic % and less than or equal to 30 atomic %, and further preferably greater than or equal to 10 atomic % and less than or equal to 30 atomic %. Here, it is desired that the second film 14b of the piezoelectric film 14 has a low concentration of the additive element to prevent the degradation of the coupling coefficient due to the degradation of the orientation and the like. Thus, to increase the electromechanical coupling coefficient of the FBAR, the total of substitutional concentrations of the divalent element and the tetravalent element of the first film 14a in the piezoelectric film 14 is preferably greater than or equal to 3 atomic % and less than or equal to 30 atomic %, more preferably greater than or equal to 5 atomic % and less than or equal to 30 atomic %, and further preferably greater than or equal to 10 atomic % and less than or equal to 30 atomic %.

To prevent the degradation of characteristics of the FBAR due to the degradation of the orientation of the piezoelectric film 14, the second film 14b preferably has a substitutional concentration of the additive element less than 3 atomic %, and more preferably is an undoped AlN film. When the second film 14b is an undoped AlN film, it is easy to form an undoped AlN film with good c-axis orientation on the lower electrode 12, and thus the piezoelectric film 14 with good c-axis orientation can be obtained. In addition, the film stress of the undoped AlN film can be made to be a tensile stress, and thus the film stress of the whole of the piezoelectric film 14 can be easily reduced and made to have an appropriate magnitude even when the concentration of the additive element of the first film 14a is high and the compression stress is thereby high. Furthermore, the adhesiveness between the electrode and the undoped AlN film is favorable, and thus good adhesiveness can be obtained between the piezoelectric film 14 and the lower electrode 12 and the upper electrode 16.

The element added to the AlN film of the piezoelectric film 14 is not limited to a divalent element or a tetravalent element, and may be other elements. For example, a trivalent element such as scandium (Sc) or yttrium (Y), an alkali metal, an alkali earth metal, or a divalent element and a pentavalent element may be the additive element. Even using those elements, the effect in increasing the electromechanical coupling coefficient of the FBAR is obtained.

Here, a description will be given of a simulation that obtained the piezoelectric constant and the electromechanical coupling coefficient of AlN containing a divalent element and a pentavalent element. The simulation was performed to doped AlN with a crystal structure in which two of the aluminum atoms 30 in FIG. 3 are substituted by a divalent element, another one of the aluminum atoms 30 is substituted by a pentavalent element with the first principle calculation. That is to say, the simulation was performed to doped AlN with a wurtzite-type crystal structure containing thirteen aluminum atoms, two divalent elements, one pentavalent element, and sixteen nitrogen atoms with the first principle calculation. Thus, the substitutional concentration of the divalent element of doped AlN used in the simulation is 12.5 atomic % and the substitutional concentration of the pentavalent element is 6.25 atomic %. Mg or Zn is used as the divalent element, and tantalum (Ta), niobium (Nb), or vanadium (V) is used as the pentavalent element. The divalent element and the pentavalent element are added at a ratio of 2:1 to secure the insulation property because both the divalent element and the pentavalent element substitute a trivalent aluminum site.

Table 5 lists values of the piezoelectric constants $e_{33}$ calculated by the first principle calculation and values of the electromechanical coupling coefficients $k^2$ calculated from the equation 1 of undoped AlN and doped AlN. As presented in Table 5, AlN containing a divalent element and a pentavalent element (Case 1 to Case 6) has a piezoelectric constant $e_{33}$ and an electromechanical coupling coefficient $k^2$ greater than those of undoped AlN (Undoped AlN in Table 5). The divalent element and the pentavalent element are not limited to those presented in Table 3, and may be other elements.

TABLE 5

| Combination | Divalent element | Pentavalent element | Piezoelectric constant $e_{33}$ [C/m$^2$] | Electro-mechanical coupling coefficient $k^2$ [%] |
| --- | --- | --- | --- | --- |
| Case 1 | Mg | Ta | 2.52 | 19.3 |
| Case 2 | Mg | Nb | 2.22 | 14.4 |
| Case 3 | Mg | V | 2.33 | 18.1 |
| Case 4 | Zn | Ta | 2.22 | 14.3 |
| Case 5 | Zn | Nb | 2.12 | 13.6 |
| Case 6 | Zn | V | 2.12 | 10.8 |
| Undoped AlN | — | — | 1.55 | 7.12 |

A description will next be given of a substitutional concentration dependency of an electromechanical coupling coefficient of AlN containing a divalent element and a pentavalent element. The substitutional concentration dependency of the electromechanical coupling coefficient was evaluated by the same method as that described in FIG. 4A and FIG. 4B. Mg is used as the divalent element, Ta is used as the pentavalent element, and a ratio of the substitutional concentrations of the divalent element to the pentavalent element is set to 2:1.

Figure 9:
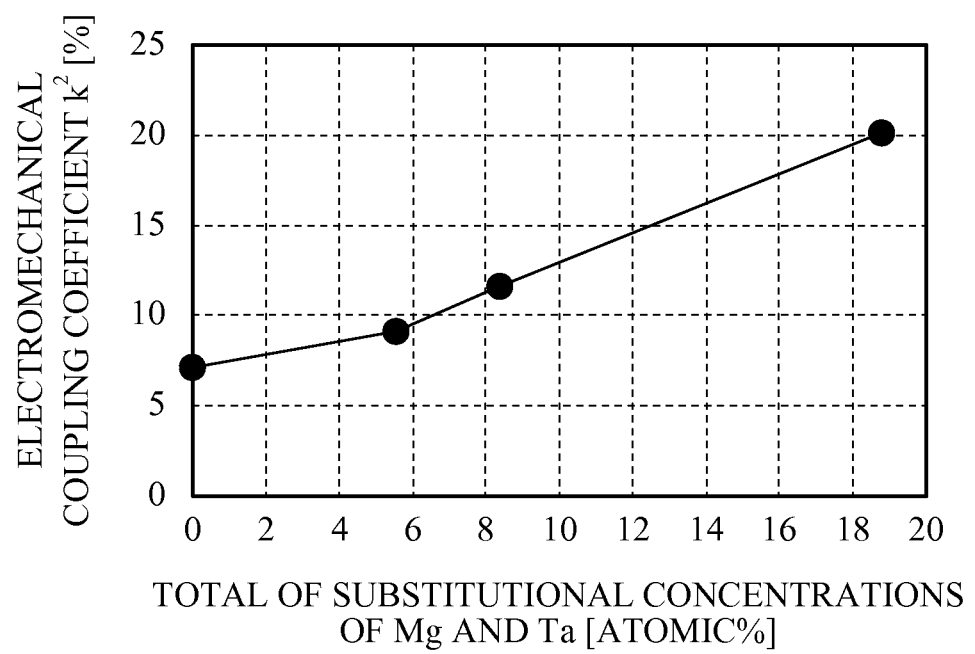
FIG. 9 is a diagram illustrating an electromechanical coupling coefficient of AlN with respect to a total of substitutional concentrations of a divalent element and a pentavalent element.

FIG. 9 is a diagram illustrating the electromechanical coupling coefficient $k^2$ of AlN with respect to a total of substitutional concentrations of the divalent element and the pentavalent element. FIG. 9 reveals that the electromechanical coupling coefficient $k^2$ increases as the substitutional concentration increases even when AlN contains Mg as a divalent element and Ta as a pentavalent element as well as when AlN contains a divalent element and a tetravalent element in FIG. 4A and FIG. 4B. In FIG. 9, described is the case in which Mg is used for the divalent element and Ta is used for the pentavalent element, but the same tendency is observed when other divalent element and pentavalent element are used.

A description will be given of a simulation that examined an effective electromechanical coupling coefficient of an FBAR in accordance with a third comparative example that uses an AlN film containing a divalent element and a pentavalent element for the piezoelectric film. The FBAR of the third comparative example has the same structure as that of the first comparative example except that an AlN film containing a divalent element and a pentavalent element and having a film thickness of 850 nm is used for the piezoelectric film 54 in FIG. 5. The values calculated by the first principle calculation are used for the values of the material constants of the piezoelectric film 54 such as a piezoelectric constant, an elastic constant, and a permittivity as well as those of the first comparative example. In addition, the substitutional concentration of the divalent element is set to 12.5 atomic %, and the substitutional concentration of the pentavalent element is set to 6.25 atomic %.

Table 6 lists simulation results of the effective electromechanical coupling coefficient $k_{eff}^2$ of the FBAR of the third comparative example. In addition, it also lists the simulation result of the effective electromechanical coupling coefficient $k_{eff}^2$ of the FBAR of the aforementioned second comparative example for comparison. As presented in Table 6, the FBARs of the third comparative example using an AlN film containing a divalent element and a pentavalent element for the piezoelectric film 54 (Case 1 to Case 6) have effective electromechanical coupling coefficients $k_{eff}^2$ greater than that of the FBAR of the second comparative example using an undoped AlN film for the piezoelectric film 54 (Undoped AlN film in Table 6). The divalent element and the pentavalent element are not limited to those presented in Table 4, and may be other elements.

TABLE 6

| Combination | Divalent element | Pentavalent element | Resonance frequency [MHz] | Anti-resonance frequency [MHz] | $k_{eff}^2$ [%] |
|---|---|---|---|---|---|
| Case 1 | Mg | Ta | 1910.3 | 2086.1 | 17.6 |
| Case 2 | Mg | Nb | 1977.0 | 2107.6 | 14.3 |
| Case 3 | Mg | V | 1835.5 | 1993.4 | 16.8 |
| Case 4 | Zn | Ta | 1968.3 | 2096.9 | 14.2 |
| Case 5 | Zn | Nb | 1926.9 | 2047.1 | 13.6 |
| Case 6 | Zn | V | 2080.1 | 2179.4 | 10.7 |
| Undoped AlN film | — | — | 1963.0 | 2024.0 | 7.22 |

The above results demonstrate that the FBAR having a large electromechanical coupling coefficient can be obtained even when a divalent element and a pentavalent element are added to the AlN film of the piezoelectric film 14. The electromechanical coupling coefficient can be further increased by increasing the concentrations of the divalent element and the pentavalent element. The divalent element and the pentavalent element are not limited to those presented in Table 5 and Table 6, and may be other elements. In addition, even when the elements presented in Table 5 and Table 6 are used, the piezoelectric film 14 may include both Mg and Zn as a divalent element and two or more of Ta, Nb, and V as a pentavalent element. That is to say, the piezoelectric film 14 may include at least one of Mg and Zn as a divalent element and at least one of Ta, Nb, and V as a pentavalent element.

Figure 10:
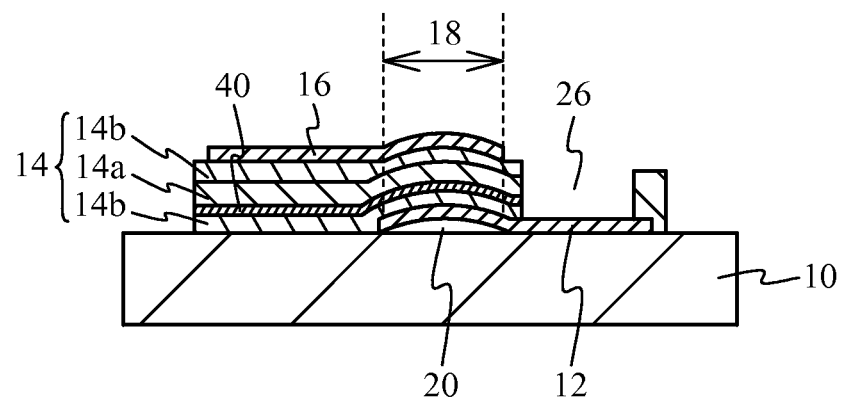
FIG. 10 is a cross-sectional view of an FBAR including a temperature compensation film.

The FBAR 100 of the first embodiment may include a temperature compensation film. FIG. 10 illustrates a cross-section of an FBAR including a temperature compensation film. As illustrated in FIG. 10, a temperature compensation film 40 is inserted into the piezoelectric film 14. The temperature compensation film 40 is located in contact with the piezoelectric film 14. The temperature compensation film 40 is formed of a material having a temperature coefficient of an elastic constant opposite in sign to that of the piezoelectric film 14. For example, the piezoelectric film 14 has a negative temperature coefficient of an elastic constant, the temperature compensation film 40 with a positive temperature coefficient of an elastic constant is used. The provision of the above-described temperature compensation film 40 enables to improve temperature characteristics of the FBAR. A silicon dioxide ($SiO_2$) film is an example of the temperature compensation film 40. Instead of an $SiO_2$ film, a film composed primarily of silicon oxide may be used, and for example a silicon oxide film to which an element such as fluorine (F) is added may be used. Here, a "film composed primarily of an element" means that the film includes the element to the extent that the temperature coefficient of an elastic constant of the temperature compensation film 40 is opposite in sign to that of the piezoelectric film 14.

In FIG. 10, the temperature compensation film 40 is inserted into the piezoelectric film 14, but may be located at other places as long as it makes contact with the piezoelectric film 14. For example, it may be located between the lower electrode 12 and the piezoelectric film 14 or between the piezoelectric film 14 and the upper electrode 16.

Figure 11A:
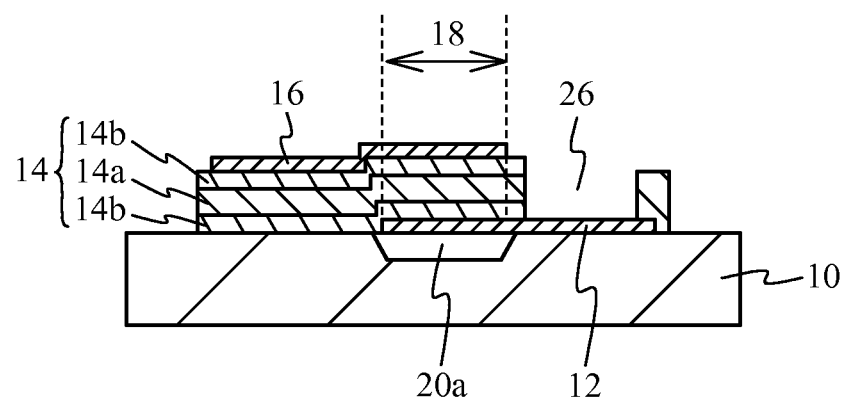
FIG. 11A is a cross-sectional view of an FBAR in accordance with a first variation of the embodiment.
Figure 11B:
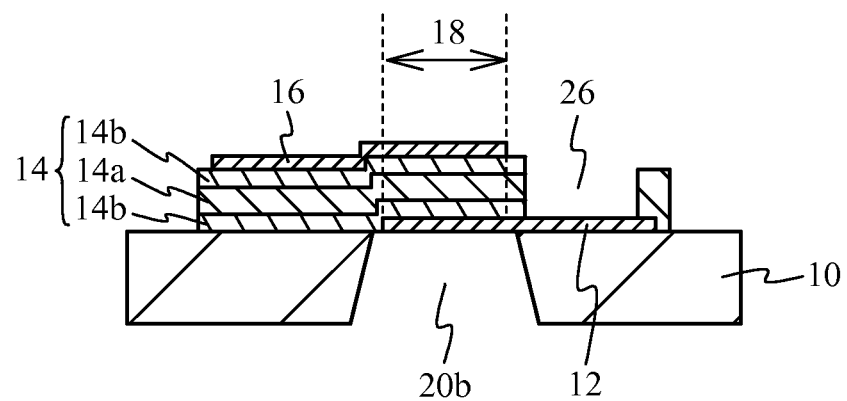
FIG. 11B is a cross-sectional view of an FBAR in accordance with a second variation of the embodiment.

The first embodiment describes an example in which the air-space 20 is formed by a dome-shaped bulge between the substrate 10 and the lower electrode 12 as illustrated in FIG. 1B, but structures illustrated in FIG. 11A and FIG. 11B may be employed. FIG. 11A illustrates a cross-section of an FBAR in accordance with a first variation of the embodiment, and FIG. 11B illustrates a cross-section of an FBAR in accordance with a second variation of the embodiment. As illustrated in FIG. 11A, in the FBAR of the first variation of the embodiment, an air-space 20a is provided by removing a part of the substrate 10 under the lower electrode 12 in the resonance portion 18. As illustrated in FIG. 11B, in the FBAR of the second variation of the embodiment, an air-space 20b is located so as to pierce through the substrate 10 under the lower electrode 12 in the resonance portion 18.

Figure 12:
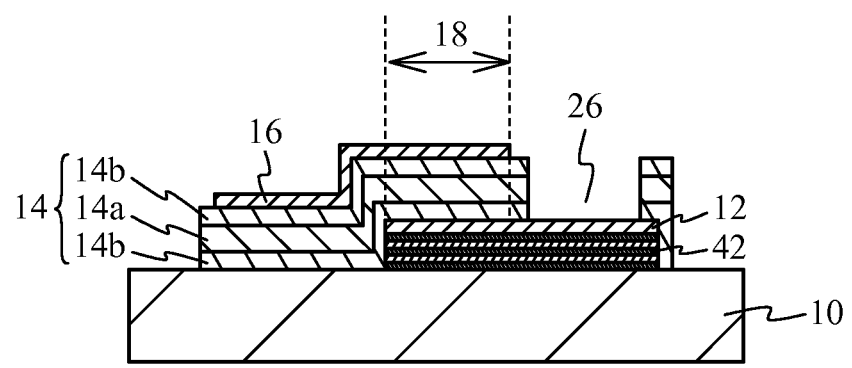
FIG. 12 is a cross-sectional view of an SMR.

In addition, the piezoelectric thin film resonator is not limited to an FBAR, and may be an SMR (Solidly Mounted Resonator). FIG. 12 illustrates a cross-section of the SMR. As illustrated in FIG. 12, in the SMR, instead of the air-space, an acoustic reflection film 42 formed by alternately stacking a film with a high acoustic impedance and a film with a low acoustic impedance to a film thickness of $\lambda/4$ ($\lambda$ is the wavelength of the acoustic wave) is located under the lower electrode 12.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
    a substrate;
    a piezoelectric film that is located on the substrate and includes a first film made of an aluminum nitride film containing an additive element and second films located on an upper surface and a lower surface of the first film and made of an aluminum nitride film containing the additive element at a concentration lower than that of the first film; and
    a lower electrode and an upper electrode that are located to sandwich the piezoelectric film.

2. The piezoelectric thin film resonator according to claim 1, wherein
    the additive element is a divalent element and a tetravalent element, or a divalent element and a pentavalent element.

3. The piezoelectric thin film resonator according to claim 2, wherein
    the additive element is a divalent element and a tetravalent element, the divalent element includes at least one of calcium, magnesium, strontium, and zinc, and the tetravalent element includes at least one of titanium, zirconium, and hafnium.

4. The piezoelectric thin film resonator according to claim 2,
    the additive element is a divalent element and a tetravalent element, a concentration of the additive element in the first film is greater than or equal to 3 atomic % and less than or equal to 30 atomic % when a total of a number of aluminum atoms of the additive element in the first film and a number of aluminum atoms of the aluminum nitride film defines 100 atomic %.

5. The piezoelectric thin film resonator according to claim 2, wherein
    the additive element is a divalent element and a pentavalent element, the divalent element includes at least one of magnesium and zinc, and the pentavalent element includes at least one of tantalum, niobium, and vanadium.

6. The piezoelectric thin film resonator according to claim 1, wherein
    the second film is made of an aluminum nitride film not containing an additive element.

* * * * *